United States Patent [19]

Readings et al.

[11] Patent Number: 4,578,341
[45] Date of Patent: Mar. 25, 1986

[54] ACIDIC PHOTOSENSITIVE RELIEF IMAGE-FORMING MATERIALS WITH INDICATOR PIGMENT OR DYE

[75] Inventors: Peter B. Readings, Chertsey; Nandor Mihalik, Walton-on-Thames; Robin Taylor, Frimley Green, all of England

[73] Assignee: Sensitisers (Research) Ltd., Deepcut, England

[21] Appl. No.: 636,810

[22] Filed: Aug. 3, 1984

Related U.S. Application Data

[63] Continuation of Ser. No. 358,665, Mar. 16, 1982, abandoned.

[30] Foreign Application Priority Data

Mar. 24, 1981 [GB] United Kingdom ................ 8109098

[51] Int. Cl.$^4$ .......................... G03C 1/60; G03C 1/71; G03C 1/68; G03C 1/76
[52] U.S. Cl. ..................................... 430/155; 430/157; 430/164; 430/165; 430/167; 430/175; 430/176; 430/188; 430/143; 430/191; 430/196; 430/270; 430/280; 430/281; 430/286; 430/289; 430/292; 430/293; 430/294; 430/271
[58] Field of Search ............... 430/175, 176, 189, 191, 430/192, 190, 177, 292, 293, 294, 196, 188, 270, 280, 281, 286, 289, 155, 157, 164, 165, 167, 271

[56] References Cited

U.S. PATENT DOCUMENTS

| | | | |
|---|---|---|---|
| 3,211,553 | 10/1965 | Ito | 430/175 |
| 3,527,604 | 9/1970 | Endermann et al. | 430/189 |
| 3,929,488 | 12/1975 | Smith | 430/191 |
| 4,288,509 | 9/1981 | Kashiwagi | 430/293 |
| 4,296,194 | 10/1981 | Harper et al. | 430/191 |
| 4,311,784 | 1/1982 | Fan | 430/166 |
| 4,374,193 | 2/1983 | Moriya et al. | 430/176 |
| 4,448,873 | 5/1984 | Wells et al. | 430/294 |

FOREIGN PATENT DOCUMENTS

| | | | |
|---|---|---|---|
| 341454 | 1/1931 | United Kingdom . | |
| 1041463 | 9/1966 | United Kingdom . | |
| 1052699 | 12/1966 | United Kingdom | 430/191 |
| 1170458 | 11/1969 | United Kingdom | 430/191 |
| 1386586 | 3/1975 | United Kingdom . | |

OTHER PUBLICATIONS

Weast, Robert C., "Handbook of Chemistry and Physics", 53rd Edition, Chemical Rubber Co., 1972, D–106+107.
Dinaburg, M. S., "Photosensitive Diazo Cpds", Focal Press, 1964, p. 161 relied on.
Lange, N. A., "Handbook of Chemistry", 8th Ed., 1952, pp. 942–946.
Grant, J., "Hackh's Chemical Dictionary", 4th Ed., 1969, pp. 344–345.

*Primary Examiner*—Charles L. Bowers, Jr.
*Attorney, Agent, or Firm*—Cushman, Darby & Cushman

[57] ABSTRACT

A relief image-forming composition having an acidic pH comprises a photosensitive component and an indicator capable of existing in two states differing in actinic opacity dependent upon pH. A relief image is formed by (1) exposing to light selected areas of a layer of the composition, the indicator being in its state of lower actinic opacity, (2) removing layer material from the exposed areas or from the unexposed areas and (3) shifting the pH in the remaining layer material to a value at which the indicator exists in its state of higher actinic opacity. The resultant image can then be used as an intermediate original in diazotype copying processes.

14 Claims, 1 Drawing Figure

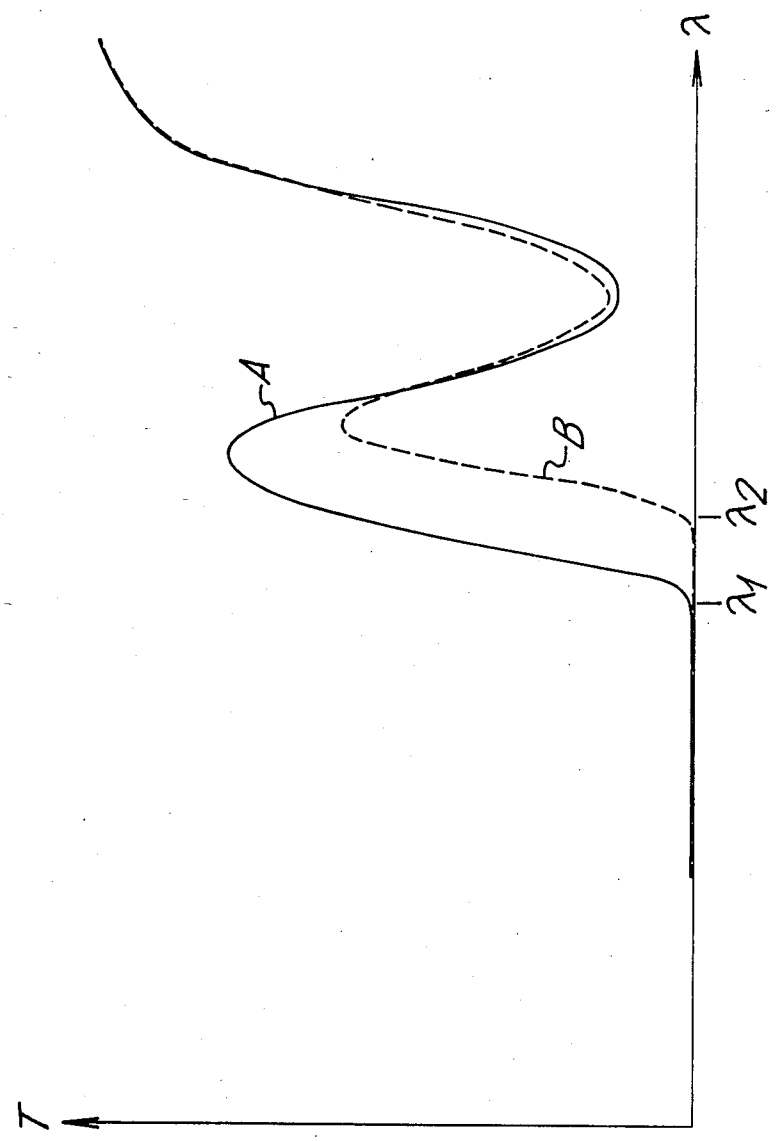

ACIDIC PHOTOSENSITIVE RELIEF IMAGE-FORMING MATERIALS WITH INDICATOR PIGMENT OR DYE

This is a continuation of application Ser. No. 358,665 filed Mar. 16, 1982, abandoned.

TECHNICAL FIELD OF THE INVENTION

The present invention relates to novel relief image-forming materials and to a method of forming relief images using such materials.

The relief images can be used as intermediate originals for making lithographic plates or for taking further copies on diazo copying materials.

BACKGROUND TO THE INVENTION

Image-forming systems based on diazo compounds are widely used. Such systems can be used to form images in a variety of ways, amongst which the diazotype process and diazo lithography are of particular importance.

In the diazotype process, two components are necessary in order to produce an image, namely a photo-sensitive diazo compound (in particular a diazonium salt) and an image-forming azo coupler (for example a phenolic or amino compound). One-component materials may be prepared that contain only the diazo compound; the coupler is then added to the developing solution. Two-component materials are also available, which contain both components; these have the advantage that after image-wise exposure they can be subjected to dry development, either by a vapour (usually ammonia vapour) or by heat. Diazotype papers can be used, for example, for the direct production of a positive copy from an engineer's drawing or the like.

Diazo compounds can be used to harden a polymer imagewise; this property is employed in the production of diazo relief images (diazo lithography). Compared with dichromatesensitized colloids, the polymers sensitized with diazo compounds can have higher printing speeds and better keeping properties, and can be used for pre-sensitized printing plates.

Detailed accounts of diazo imaging systems will be found in Kosar, "Light-Sensitive Systems" (1965) published by John Wiley & Sons, and in Jacobson and Jacobson, "Imaging Systems" (1976), published by Focal Press Limited, both of which are incorporated herein by reference.

Diazo compounds in general are sensitive only to radiation in the near ultra-violet, violet and blue regions of the spectrum. The photochemical sensitivity of the diazo compounds in general use is in each case limited to a very narrow spectral region, the peak sensitivity being commonly at 375 nm, although with particular diazo compounds the peak sensitivity may be at a higher wavelength, for example from 400 to 420 nm. The sensitivity spectrum corresponds closely to the absorption spectrum when the absorption of the base material, e.g. paper, has been taken into consideration.

It is possible to sensitize diazonium compounds to decomposition by light of other wavelengths, for example red light. Thus, the absorption spectrum of a solution of 4-diazodiphenylamine sulphate in the presence of methylene blue and sodium p-toluenesulphinate exhibits a peak at about 675 nm.

It will be clear that for optimum exposure of a diazo-sensitized imaging material, it is necessary to irradiate that material with actinic radiation containing wavelengths to which the diazo compound is substantially sensitive. Suitable radiation can be produced by mercury-vapour lamps, the light output of which has peaks (the mercury lines) at 313.2, 334.2, 336, 404.7, 435.8, 546.1 and 577 nm. Of these, the two highest and the two lowest peaks are of little practical importance. The peaks at 366 and 404.7 nm have a destructive effect on a large number of benzene and naphalene diazonium salts and are therefore most important for, for example, standard diazotype papers. The peak at 435.8 nm is of particular importance with the so-called superfast diazo compounds (e.g. the morpholino derivatives of diazo-p-aminobenzenes), the absorption spectrum of which is shifted towards the visible region. Image-wise exposure of the diazo-sensitized material is effected through an original (or intermediate original) having an image (whether positive or negative) defined by areas having a differential opacity to actinic light. It will be evident that for optimum image-wise exposure, the image in the original or intermediate original should be defined by one or more areas having a high absorption (low to zero transmission) of wavelengths to which the diazo compound is substantially sensitive, the remaining area or areas of the original or intermediate original having a high transmission of such wavelengths.

As indicated above, the present invention is concerned with novel relief image-forming materials that can be used as intermediate originals in the above manner. Imaging systems based on wash-out reliefs have been known for many years and are based on the phenomenon that when certain materials or combinations of materials are applied as a coating or layer on a support and acted upon by light either a hardening or a solubilising effect takes place in the light-exposed areas. In the case of the hardening effect by light the unexposed areas can be washed away with water or other solvent resulting in a positive image from a negative original; in the case of the solubilising effect by light the exposed area can be washed away with water or other solvent, resulting in a positive image from a positive original.

Other systems have been proposed in which the light-exposed areas of the layer can be insolubilised to water and solubilised to another solvent. Thus, by the correct choice of wash-off liquid, a negative or a positive image can be obtained from the same original.

In most cases the exposed areas do not substantially differ visually from the unexposed areas but only physically and/or chemically, especially in the degree of solubility. The exposed layers are then used to produce visible images.

This can be done in various ways. Thus, for example:

(a) a dye or pigment can be introduced into an exposed dichromated colloid layer by imbibition into the relief followed by rinsing with water or other solvent whereby the soluble areas of the layer are washed away leaving a visible relief image; or (b) silver halide can be included in a dichromated colloid layer, whereby the silver halide is retained in the hardened layer after exposure and washing and the visible silver image can be obtained by development in a photographic developer followed by washing; or (c) a dye or pigment can be introduced into the layer before coating whereby, after exposure, the soluble areas of the coating can be washed away together with the dye or pigment leaving a visible relief image.

There are drawbacks to these methods, however. Method (a) involves the use of inks and dyes after exposure and washing, which is messy and tedious as well as requiring an extra operation. Method (b) involves expensive silver salts and the extra operation of development of the silver image and further washing.

Method (c) employs the principle of the "pigment paper process" (carbon printing) first proposed in 1855 by the French engineer and chemist Alphons Louis Pointevin, who added powdered carbon to a sensitized gelatin solution thereby making an advance in the direction of obtaining visible and permanent images. After exposure and washing, the carbon particles remained imbedded in the tanned gelatin. But, as stated by Kosar, op cit page 116: "The use of silver halides is preferred over the incorporation of pigments such as carbon black or dyes because such substances would absorb a large proportion of the light required for the photochemical reaction. This would necessitate greatly increased exposure times." Nevertheless method (c) is greatly preferred over methods (a) and (b) for its easier processing, involving, as it does, simple washing and drying, and for its avoidance of the use of silver salts (which are expensive).

The light-absorption properties of pigments or dyes incorporated in any relief photo-imaging system have hitherto been a barrier to the obtaining of reasonable exposure times for such systems using conventional exposure or printing equipment. There is thus a need for a relief photo-imaging system that includes a suitable colouring agent whilst exhibiting acceptable exposure times.

The production of a visible image upon exposure of a pre-sensitized lithographic plate may be desirable in that it permits an easier assessment for quality. Moreover, in the "step and repeat" process of preparing a lithographic plate, such a visible image allows the operator to ascertain at any stage of the process which areas of the plate have already been exposed. Thus, GB-PS No. 1,041,463 discloses a lithographic plate comprising a metal sheet and a layer thereon of a light-sensitive composition, which composition comprises a diazo compound and an acid-base indicator. Exposure of the composition to light causes the indicator to change colour owing to the release of an acid upon the decomposition of the diazo compound under the action of light.

The preferred colour change described in GB-PS No. 1,041,463 is from colourless to a distinctly visible but ultraviolet transmitting colour; clearly, the UV-transmitting properties of such an indicator would be of little utility in an intermediate original, as discussed above, which would require one or more areas of high actinic opacity. The said British specification does contemplate the use of indicators that act as ultra-violet absorbers before or after exposure. This means that absorption must also occur during exposure, which can only serve to prolong the exposure time.

GB-PS No. 1,386,586 discloses a photo-resist composition comprising a light-modifiable material, a photosensitizer and a dye in an Homolka base form. Upon image-wise exposure to light the light-struck areas are modified to permit selective removal of material from the exposed or the unexposed areas of the layer in order to form a relief image. It is desirable that the image should be readily visible. To this end, the Homolka base is converted into the parent dyestuff either during exposure, by incorporating a material into the composition that will generate an acid or acidic compound on exposure to actinic light, or during development by carrying out the selective removal of material by treating the layer with a solvent that contains an acid or acidic compound.

The use of an Homolka base necessitates the use of a non-acidic composition. Furthermore, there is no teaching in GB-PS No. 1,386,586 with regard to the formation of relief images that would be suitable for use as intermediate originals.

SUMMARY OF THE PRESENT INVENTION

The present invention now provides a relief-forming composition comprising a photosensitive component and having incorporated therein an indicator, being a substance capable of existing in two states that differ in actinic opacity depending upon pH, the composition having an acid pH at which the indicator is in the state of lower actinic opacity and is maintained in substantially that state during exposure of the composition to actinic light, the composition being such that its pH can be shifted after exposure, to a value at which the indicator exists in its state of higher actinic opacity.

The present invention also provides a method of forming a relief image which comprises (1) exposing a layer of a relief image-forming composition according to the present invention to actinic light in an imagewise manner (2) removing layer material from the exposed composition in an imagewise manner and (3) shifting the pH in the remaining layer material to a value at which the indicator exists in its state of higher actinic opacity.

The composition according to the present invention can be applied as a layer on to any suitable support in order to provide a relief-image forming element, such as a sheet of film or a plate.

The present invention also provides a process for forming an image on a photosensitive material, for example a diazotype material or a diazo lithographic material, which comprises the image-wise exposure of that material to actinic light through a relief-image formed according to the present invention.

BRIEF DESCRIPTION OF THE DRAWING

The accompanying drawing shows the absorption of an indicator at two different pH values. Each curve is a plot of transmission against wavelength.

DESCRIPTION OF THE PREFERRED EMBODIMENTS

Although the indicator has been qualified by reference to two states that differ in actinic opacity, that is not intended to exclude the possibility of other, for example intermediate, states. For convenience herein, the shift between the two specified states may be referred to as a "colour shift".

In certain embodiments, the normal pH of the relief image-forming composition will be at a sufficiently acidic level to ensure that the indicator exhibits its lower actinic opacity prior to and during exposure of the photosensitive material. After exposure, the indicator may be shifted to its state of higher actinic opacity by applying an acidic or basic material (as appropriate to achieve the pH required for the colour shift), conveniently in an aqueous or other solution. An acidic or basic solution may be eployed as a rinsing shower or bath and conventiently is employed also to effect removal of layer material (i.e. steps (2) and (3) of the present method can be effected simultaneously). The use of an acidic or basic vapour or gas (e.g. HCl or NH₃) is also possible.

However, it is also possible to employ an indicator that exhibits its lower actinic activity at a pH higher or lower than the normal pH of the layer material. In such cases, the image-forming material will also have incorporated therein a pH-modifying agent, being a substance capable of establishing a pH at which the indicator is in the state of lower actinic opacity, the pH-modifying agent being such that its effect can be nullified to an extent that the indicator shifts to the state of higher actinic opacity. In preferred embodiments, the indicator will be such that it exhibits the lower actinic opacity at the lower pH level. Commonly, the normal pH of the composition will be insufficiently acidic and in such cases the pH-modifying agent will be a pH lowering substance, in particular an acid or an acid-reacting compound.

In order to nullify the effect of the pH-modifying agent, it is preferred that it be capable of being removed from the photosensitive composition by washing it out, or that it be capable of being neutralised.

Thus, preferred embodiments of the present invention consist of photosensitized layers capable of giving relief images which include in the layers indicators capable of giving actinic opacity, wherein such indicators are selected from those substances which are capable of shifting their colour or decolourising when subjected to lower pH, so that the colour-shifted colour of the substance does not substantially affect the initial exposure time required for obtaining the relief image. The photosensitive layer contains an acid or other pH-lowering agent which holds the coloured substance in its colour-shifted state prior to and during exposure, which pH-lowering agent is capable of being washed out of, or neutralised in, the layer to allow the indicator to return to an elevated state of pH and thus to its natural colour.

It will be appreciated, of course, that the indicator and the pH-modifying agent can, in either case, be composed of a mixture of compounds.

Removal of layer material is generally effected by washing with a suitable solvent, for example water. The nullifying of the effect of the pH-modifying agent is preferably effected concurrently with that washing step. Thus, the solvent may act to leach out the pH-modifying agent from the exposed or unexposed areas, or the solvent may comprise a substance that will neutralise the pH-modifying agent. However, it is also possible to effect such neutralization in a separate step, for example with an acidic or basic (as required) solution or gas.

The photosensitive layer may be supported on any suitable substrate which may be pretreated or post-treated, if appropriate. A substrate of polyethylene terephthalate in the form of a film, pretreated for adhesion, is suitable. However, good results can be obtained with other base or substrate materials, for example cellulose acetate, ethyl cellulose, polystyrene, polycarbonates, polypropylene or polyethylene, as well as, preferably waterproofed, papers and cloths.

The photosensitive layer will generally be at least 5 μm in thickness, in order to obtain adequate visual density. A thickness of 10 μm is preferred.

The indicator may be a dye or pigment which reversibly changes its colour with pH or indeed any substance which exhibits this phenomenon and is capable of being included in the photosensitive layer for obtaining relief images. In the unexposed composition, there should be sufficient acidity to shift the dye or pigment to the decolourised state or state of lower actinic opacity. The required degree of acidity will vary according to the dye or pigment structure.

In addition to the indicators referred to later in the specific Examples, the following compounds may be mentioned as being suitable:

4-diethyl-aminobenzene azo acetoacetanilide;
4-diethylaminobenzene azo 4-morpholino acetoacetanilide;
4-pyrrolidino 3-chlorobenzene azo cyanoacetmorpholide;
4-pyrrolidino 3-chlorobenzene azo 4-morpholino acetoacetanilide;
4-diethylamino 3-chlorobenzene azo 4-morpholino acetoacetanilide;
4-diethylamino 2-methylbenzene azo acetoacetbenzyl amide;
4-cyclohexylmethylamino 3-chlorobenzene azo acetoacetbenzyl amide;
4-cyclohexylmethylamino 3-chlorobenzene azo cyano acetmorpholide;
4-di-n-butyl 3-chloroaminobenzene azo cyanoacetmorpholide;
4-diethyl-amino 3-chlorobenzene azo acetoacetanilide;
4-hexamethylene-imino-3-chlorobenzene azo cyanoacetmorpholide; and
4-morpholinobenzene azo acetoacetbenzylamide.

The indicator can be in various physical states. Thus, for example, it may be soluble in a solution containing the pH-modifying agent; in such cases the colour shift caused by the pH-modifying agent will be rapid.

Alternatively, the indicator may be in the form of a fine (milled or micronized) dispersion. In this case, decolourisation may not occur merely on addition of the pH-modifying agent, e.g. an acid; heating (e.g. in a drying step) may be required, for example to a temperature at or just below the melting point of the indicator, to achieve decolourization. However, it is also possible to employ a dispersed pigment that will decolourize upon addition of the pH-modifying agent. The use of dyes in the colloidal state is also feasible.

The concentration of the indicator can vary widely, according to the system used and the intended application. For example, in a 100% solids (solventless) system, one might use 1 part by weight, or more, of indicator per 2 parts of photopolymer. In other systems the concentration may be lower; in some cases much lower. The optimum concentration of the indicator can be readily determined by the skilled person for any given case.

The photosensitive layer carrying the indicator may comprise, for example, dichromated colloids such as gelatine, polymeric layers tannable by diazonium salts or azides and their derivatives, layers without polymers and comprising diazo compounds, diazo ketones, imino quinones, diazides, diazosulphonates, o- and p-quinone diazides and some azides, photopolymers and photo-cross-linking and photosensitive polymers, although the invention is not limited thereto.

The method of this invention is widely applicable; thus, for example, it can be used with (i) light-hardening components (ii) with light-solubilizing components or (iii) with components that upon exposure are solubilized to one solvent and rendered insoluble in another solvent. Thus for instance, one could obtain a positive image or a negative image from an original dependent upon the choice of photosensitive component, as in cases (i) and (ii), or of wash-off liquid, as in case (iii).

At the state of lower actinic opacity, the indicator should absorb insufficient light to retard or inhibit the photochemical reaction in the relief-image-forming composition to any substantial degree. At the state of higher actinic opacity, the indicator should absorb sufficient light to enable the exposed and developed film to permit reproduction of the image, for example on diazo copying material or by means of a printing plate produced from the film by customary methods; in this state it acts as a masking agent.

The expression "actinic opacity" herein includes "visual density" or "colour intensity" or "light absorbency". These expressions imply that an increase in actinic opacity refers to an increase in absorbency (or a decrease in transmission) by the indicator at one or more given wavelengths. However, the applicants' research has shown that actinic opacity can be altered by shifting the wavelengths at which the indicator exhibits its peak transmission; the expression "actinic opacity" is to be construed accordingly.

This concept may be explained by reference to the accompanying drawing which shows a plot of transmission T against wavelength $\lambda$ for an indicator present in a relief image-forming composition of the present invention, both in the unexposed, undeveloped state (curve A) and in the exposed and developed state (curve B). The undeveloped composition in this case contained an acid, which acid was washed out of the composition after exposure by means of the aqueous liquid used for developing the relief image.

It will be apparent from curve A that the indicator can be used in a relief-image-forming composition containing a component that is sensitive to wavelengths greater than $\lambda_1$. Thus, the indicator could be used with a photosensitive component that shows peak sensitivity at $\lambda_2$. However, after development and the consequent shift in pH, the indicator allows virtually no transmission at $\lambda_2$ and has therefore become opaque to actinic light at that wavelength. Thus, the exposed and developed system can be used, for example, as an intermediate original for the imagewise exposure of a diazotype material or a diazo lithographic material that exhibits peak sensitivity at or around $\lambda_2$. In general, sufficient actinic opacity is obtained by a transmission density reading higher than 2.0 on a Macbeth Densitometer Model TR927 when using a filter which transmits light in wavelengths 360–400 nm and higher than 2 when a filter is used which transmits light in the region 380–540 nm. Traditionally in the trade these filters are known as the UV and blue filters respectively.

If the wavelength at which transmission approaches zero is labelled $\lambda_1$ for the unexposed composition and $\lambda_2$ for the exposed and developed composition, then in most cases $\lambda_2$ will be greater than $\lambda_1$ as shown in the drawing. However, the converse is true for certain indicators, for example 3-methyl-4-pyrrolidino-benzene-azo-α-resorcylic acid monoethanolamide (which is red at a neutral pH but yellow in acid conditions), 2,5-dibutoxy-4-morpholinobenzene-azo 1-phenyl-3-methyl-5-pyrazolone (orange when neutral but yellow when acid) and 3-methyl-diethylaniline-azo α-resorcylic acid monoethanolamide (magenta when neutral but yellow when acid).

The relief image-forming composition of the present invention represents an advance in the art. It permits the production of relief images of excellent actinic opacity yet gives exposure times that are acceptable in practice. The materials exhibit the advantages common to silverless systems and have the further advantage of good stability and shelf life (thought to be due to the acidic nature of the compositions). Although the use of the relief images of the invention has been described with reference to the production of further copies using diazo materials, it will be understood that they can be used with any other photosensitive copying systems which exhibit photosensitivity at the wavelengths to which the relief image is opaque.

The invention is illustrated by the following examples:

EXAMPLE 1

A sheet of polythylene terephthalate film of the type X542 produced by Imperial Chemical Industries Ltd., was coated with the following composition and dried in a current of warm air:

6 grams "Mowiol 18–88" (a polyvinyl alcohol of 88% hydrolysis and acetyl radical 11% sold by Hoechst (UK) Ltd),
20 grams ethyl alcohol,
30 grams acetone,
43 ml distilled water,
1.5 ml concentrated hydrochloric acid,
0.45 gram condensation product of diphenylamine-4-diazonium fluoroborate with formaldehyde, and
3 grams 4-pyrrolidino-3-methyl-benzene-azo-acetoacetbenzylamide (yellow azo dye).

The dried material had a very pale yellow colour largely due to the natural colour of the diazonium compound. The yellow azo dye was almost completely decolourised as it was in its acid-shifted state.

The film was exposed to light under a negative original which resulted in an even paler appearance in the light-hardened exposed areas; it was unchanged in the unexposed areas. Washing with tepid water using a fine spray resulted in the unexposed areas being washed away and the exposed light-hardened areas remaining on the film.

Concurrently with the washing out of the unexposed areas, the residual acidic components in the coating were removed, whereby the acid-shifted dye in the hardened areas reverted to its natural deep yellow colour. Thus a relief image remained consisting of a yellow positive image in a hardened layer.

The copy had excellent actinic opacity and was very suitable for use as an intermediate original for making a litho plate or for taking further copies on diazotype paper.

In the case of a comparison coating composition that does not contain the acid component (i.e. the dye remains in its unshifted natural colour in the coating composition) then a very much longer, almost unacceptable, exposure time is required and furthermore, one risks incomplete hardening of the layer in the exposed areas, due to interference of the light by the yellow dye, to the extent that the whole latent image will wash away.

If it is desired to make the image visually more intense an additional dye or pigment, for instance a blue dye or pigment, can be added to the mix in such a quantity that it does not materially affect the initial exposure time but makes the copy more easily readable.

EXAMPLE 2

A film similar to that used in Example 1 was coated with a composition prepared as follows.

The following mixture was prepared:
2 grams 4-diethylamino-3-chloro-benzene azo acetoacetbenzylamide (yellow dye),
2 grams Mowiol 18-88 (as in Example 1), and
36 ml distilled water.

The mixture was ball milled until the dye, not being soluble in the mix, reached a particle size of about 1-5 microns; the whole was then added to the following mix:
4 grams Mowiol 18-88,
44 ml distilled water,
10 grams ethyl alcohol,
1.5 ml concentrated hydrochloric acid, and
0.45 gram condensation product of diphenylamine-4-diazonium fluoroborate with formaldehyde.

In this case the yellow dye was insoluble in the mix and therefore behaved as a pigment.

The pigment was decolourized during the drying step, which was effected at 120° C. for 30 seconds.

By exposing the film to light under a positive original and following the procedure as described in Example 1 there resulted a yellow relief image in negative, which image had as good an actinic opacity as the copy obtained in Example 1.

EXAMPLE 3

A film similar to that used in Example 1 was coated with a composition prepared as follows.

The following mill charge was prepared:
10 grams 4-diethylamino-benzene azo acetanilide (yellow dye),
5 grams Mowiol 18-88 (as Example 1), and
85 grams distilled water.

The mixture was milled until the dye, not being soluble in the mix, reached a particle size of about 1-5 microns.

Part of the resultant mill grind was added to the remainder of the formula as follows:
25 grams of above pigment grind,
6 grams Mowiol 18-88,
55 grams distilled water,
10 grams ethyl alcohol,
3 ml conc. hydrochloric acid,
0.45 gram condensation product of diphenylamine-4-diazonium fluoroborate with formaldehyde.

Immediately after addition of the acid the solution decolourized. It was then coated onto the substrate and processed as in Example 1 with similar results.

EXAMPLE 4

The following formulation was made up:
2 grams 4-diethylamino-3-chloro-benzene azo acetoacetbenzylamide (yellow dye),
20 grams acetone,
1.5 ml concentrated hydrochloric acid,
30 grams RO.220, a diazo resin of the 2,1-naphthoquinone-diazide-5-sulpho ester type (from Rohner, Switzerland),
25 grams methyl glycol, and
25 grams ethyl alcohol.

The dyestuff decolourized on addition of the acid component.

The solution was coated onto a substrate as in Example 1. After drying, it was exposed and developed with dilute sodium hydroxide solution. The part of the film which had been exposed to the ultra-violet light became soluble in the dilute alkali. The film was then rinsed with tap water and dried. At this stage the film only had the colour of the diazo resin. To obtain the full colour of the dyestuff the film was exposed to ammonia vapour when the full yellow colour appeared. This colour had a high actinic opacity.

This system could also be used with a dispersed pigment in place of a dissolved dye.

We claim:

1. A relief-image forming material comprising a substrate having an acidic photosensitive layer thereon, said layer comprising in admixture a photosensitive component, selected from the group consisting of light-hardening components, light-solubilising components and components that upon exposure to actinic light are solubilised to one solvent and rendered insoluble in another solvent, and an indicator, being a substance selected from pigments and dyes capable of existing in two states that differ in actinic opacity relative to light of at least one given wavelength in the range of from 360 to 540 nm depending on pH, said indicator being in a state of lower actinic opacity in the unexposed material and being capable of remaining in substantially such a state during exposure to actinic light and of shifting to a state of higher actinic opacity after exposure to actinic light upon a shift of the pH of the photosensitive layer to a higher pH value, said indicator being present in an amount effective to produce, after the shift to its state of higher actinic opacity and after removal of a portion of said layer, a relief image having an actinic opacity corresponding to a transmission density greater than 2 as measured on a Macbeth densitometer using a filter that transmits light at said given wavelength.

2. A material according to claim 1, characterised in that the photosensitive layer comprises a diazo compound and a polymer that is tannable by the diazo compound under the action of actinic light.

3. A material according to claim 1, characterised in that the substrate is a sheet of film or a plate.

4. A material according to claim 1, characterised in that the substrate is a film of a material selected from polyethylene terephthalate, cellulose acetate, ethyl cellulose, polystyrene, polycarbonate, polypropylene and polyethylene.

5. A material according to claim 1, 2 or 4, characterised in that the indicator exhibits its lower actinic opacity at a pH lower than the normal pH of the photosensitive layer, the layer having incorporated therein a pH-modifying agent, selected from acids and acid-reacting compounds, that acts to establish a pH at which the indicator is in the state of lower actinic opacity, the pH-modifying agent being such that its effect can be nullified, after exposure, to an extent that the indicator shifts to the state of higher actinic opacity.

6. A material according to claim 5, characterised in that the pH-modifying agent is capable of being washed out of the layer, after exposure, thereby raising the pH of the layer.

7. A material according to claim 5, characterised in that the pH-modifying agent is capable of being neutralised in the layer, after exposure, thereby raising the pH of the layer.

8. A material according to claim 1 or 2, characterised in that the indicator is in its state of lower actinic opacity at the normal pH of the layer, the said layer being such that its pH after exposure can be raised by treatment with a basic substance.

9. A material according to claim 1, characterised in that there is incorporated in the photosensitive layer a colouring substance that does not substantially vary in actinic opacity with variations in pH.

10. A material according to claim 1, characterised in that the indicator is selected from 4-pyrrolidino-3-methylbenzene azo acetoacetbenzylamide, 4-diethylamino-3-chloro-benzene azo acetoacetbenzylamide, 4-diethylamino-benzene azo acetanilide, 4-diethyl-amino-benzene azo acetoacetanilide, 4-diethylaminobenzene azo 4-morpholino acetoacetanilide, 4-pyrrolidino 3-chloro-benzene azo cyanoacetmorpholide, 4-pyrrolidino 3-chlorobenzene azo 4-morpholino acetoacetanilide, 4-diethylamino 3-chloro-benzene azo 4-morpholino acetoacetanilide, 4-diethylamino 2-methylbenzene azo acetoacetbenzyl amide, 4-cyclohexylmethylamino 3-chlorobenzene azo acetoacetbenzyl amide, 4-cyclohexylmethylamino 3-chlorobenzene azo cyano acetmorpholide, 4-di-n-butyl 3-chloroaminobenzene azo cyanoacetmorpholide, 4-diethyl-amino 3-chlorobenzene azo acetoacetanilide, 4-hexamethylene-imino-3-chlorobenzene azo cyanoacetmorpholide, and 4-morpholinobenzene azo acetoacetbenzyl amide.

11. A material according to claim 1, characterised in that the indicator is capable of existing in two states depending on pH, which states differ in actinic opacity relative to light of at least one given wavelength in the range from 360 to about 435 nm.

12. A material according to claim 1, characterised in that the indicator is capable of existing in two states depending on pH, which states differ in actinic opacity relative to light of at least one given wavelength in the range from 360 to 400 nm.

13. A material according to claim 1, characterised in that, at the pH of the acidic photosensitive layer, the pigment or dye is capable of transmitting light at the wavelength at which the photosensitive component exhibits sensitivity.

14. A relief-image forming material according to claim 1, characterised in that the two states that differ in actinic opacity are constituted by two states that differ in the wavelength at which the indicator exhibits its peak transmission, said substance being in the state at which its transmission is at the lower wavelength at the pH of the acidic photosensitive layer.

* * * * *